United States Patent [19]

Endo et al.

[11] Patent Number: 4,628,510

[45] Date of Patent: Dec. 9, 1986

[54] MEMORY DEVICE

[75] Inventors: Shuichi Endo, Takasaki; Kenichi Tonomura, Gunma, both of Japan

[73] Assignees: Hitachi, Ltd.; Hitachi Microcomputer Engineering Ltd., both of Tokyo, Japan

[21] Appl. No.: 601,720

[22] Filed: Apr. 18, 1984

[30] Foreign Application Priority Data

Apr. 22, 1983 [JP] Japan .................................. 58-69967

[51] Int. Cl.⁴ ............................................ G01R 31/28
[52] U.S. Cl. .................................... 371/21; 324/73 R
[58] Field of Search ........... 371/21; 324/73 R, 73 AT

[56] References Cited

U.S. PATENT DOCUMENTS

| | | | |
|---|---|---|---|
| 3,805,152 | 4/1974 | Ebersman et al. ................. | 324/73 R |
| 4,301,535 | 11/1981 | McKenny et al. .................... | 371/21 |
| 4,320,507 | 3/1982 | Fukushima et al. .................. | 371/21 |
| 4,459,694 | 7/1984 | Ueno et al. .............................. | 371/21 |

FOREIGN PATENT DOCUMENTS 0011974 6/1980 European Pat. Off. .
0032015 7/1981 European Pat. Off. .

*Primary Examiner*—Charles E. Atkinson
*Attorney, Agent, or Firm*—Antonelli, Terry & Wands

[57] ABSTRACT

A memory device in accordance with the invention has an array of memory cells including a plurality of main memory cells which are adapted to be utilized by a user for storing information and a plurality of checking memory cells which store data placed therein at the time of manufacturing of the array which is read out to check a performance characteristic of the array of memory cells prior to the storing of data in the main memory cells. Addressing means are associated with the array of memory cells for permitting selective addressing of either the main memory cells or the checking memory cells within the array by the application of selected first or second signal levels to addressing lines coupled to the array. An output circuit is coupled to the array of memory cells for outputting data from within selected cells within the array in cooperation with the addressing circuit. An inhibiting circuit is provided for inhibiting the outputting of data from the output circuit in response to the application of a control signal of a first predetermined magnitude.

5 Claims, 5 Drawing Figures

MEMORY DEVICE

BACKGROUND OF THE INVENTION

1. Field of the Invention

The present invention relates to a memory device and, more particularly, to a programmable read-only memory.

2. Description of the Prior Art

RAMs (random access memories) and ROMs (read-only memories) are memory devices which are used in a variety of electronic machines such as electronic computers. ROMs include PROMs (programmable ROMs), one type of which is the bipolar PROM.

As is well known in the art, PROMs are divided into those using fuses and those using diodes. In the former type of PROM, data is written by applying a constant voltage of several volts to melt a fuse made of polysilicon or nichrome. In the latter type of PROM, on the other hand, the data writing operation is conducted bit by bit by destroying PN junctions with constant-current pulses of a pulse width of about 10 $\mu$secs. As a result, after writing data therein PROMs cannot have their data erased.

Semiconductor memory devices are used widely, not only in microcomputers and minicomputers, but also in large-scale computers, as their capacities and speed continue to increase, and their power consumption increase. With the increase in capacity and speed, the components of the semiconductor memory devices are reduced further in size so that the fabrication process thereof becomes even more complex. Even a slight difference in the fabrication process conditions results in the completed memory devices having variations in their characteristics, which may cause the products to fail to meet their desired specifications. Accordingly, semiconductor memories must be checked for compliance with specifications before shipment to the user. For example, it is necessary to check whether or not the access time (i.e., the time interval from the instant when an input specifying an address is given, to the instant when the data stored in the predetermined memory cell is read out) meets the required specification. As has been described above, however, since no data can be written into the PROM before the user uses it, checking for compliance with the access time specification of a PROM has not been possible.

The present inventors have, therefore, developed a system by which specifications are checked, by providing and using a checking memory cell which is separate from the memory cell used by the user and which has data written into it in advance at the fabrication stage.

FIG. 1 is a schematic circuit diagram of a portion of a semiconductor memory device developed by the present inventors before the present invention. The checking method will be described with reference to FIG. 1. Memory cells $C_1$, $C_2$, $C_3$, $C_4$, $C_5$, $C_6$, $C_7$, $C_8$ and $C_9$ are provided so as to intersect word lines $Xl_1$, $Xl_2$ and $Xl_3$ and bit lines $Yl_1$, $Yl_2$ and $Yl_3$. Memory cells $C_1$, $C_2$, $C_3$, $C_6$ and $C_9$ are used for checking operations, and memory cells $C_4$, $C_5$, $C_7$ and $C_8$ provide memory circuits which are used as required by the user.

During checking, a voltage signal of about 8 V is supplied to a word input X and a bit input Y. The voltage level of 8 V is that used in the checking. Two values of 0 V and 3 V are used when the user is using the PROM. In FIG. 1, the threshold voltages of inverters $IV_1$ and $IV_5$ are set at 7 V, and those of inverters $IV_2$, $IV_3$, $IV_4$, $IV_6$, $IV_7$ and $IV_8$ at 1.5 V. The setting of the threshold voltages of the inverters associated with the checking memory cells at a higher value is designed to prevent the user from reading the data written into the checking memory cells during the manufacture of the PROM.

A method of selecting the directions of the word lines of the checking memory cells will now be described. The word lines and bit lines are selected when they go high. The word lines $Xl_2$ and $Xl_3$ are not selected. When the voltage signal of 8 V is supplied through the word input X and the bit input Y, the output of the inverter $IV_1$ of checking circuit 1 goes to a low level (L level), and the output of the inverter $IV_2$ goes to a high level (H level). As a result, the output of a word driver $A_1$ goes high so that the word line $Xl_1$ is selected.

Similarly, the output of the inverter $IV_5$ forming a checking circuit 2 goes to L level, and the output of the inverter $IV_6$ goes to H level. The output of the inverter $IV_7$ also goes to L level, and the output of the inverter $IV_8$ to H level. As a result, the input terminal a of an AND circuit $A_{11}$ goes to L level. The input terminals a and b of an AND circuit $A_{12}$ respectively go to H level and to L level. The outputs of the AND circuits $A_{11}$ and $A_{12}$ are fixed at L level irrespective whether the data written in the memory cells $C_1$ and $C_2$ is at the level "1" or "0". Since the input terminal a of an AND circuit $A_{13}$ is at H level, the data stored in the memory cell $C_3$ is outputted from the AND circuit $A_{13}$, and through NOR circuit $O_1$. Thus, the data in the memory cell $C_3$ is read out.

In each memory cell, the state in which either the fuse is melted or the diode is destroyed corresponds to the level "1", and the undestroyed state thereof corresponds to the level "0".

When the memory cell $C_2$ is to be checked, the voltage signal of 8 V is supplied to the word input X, and a voltage signal of about 3 V is supplied to the bit input Y. This selects the word line $Xl_1$, as described above. Since the output of the inverter $IV_5$ is at H level and the output of the inverter $IV_8$ is also at H level, the bit line $Yl_2$ is selected so that the data in the memory cell $C_2$ is read out from the AND circuit $A_{12}$.

When the memory cell $C_1$ is being checked, moreover, the bit input Y is dropped to 0 V, so that the word line $Xl_1$ is selected in the same way. However, the output of the inverter $IV_5$ is at H level, and the inverter $IV_6$ at L level. Moreover, the output of the inverter $IV_7$ is at H level, and the output of the inverter $IV_8$ is at L level. In this case, the bit line $Yl_1$ is selected so that the data in the memory cell $C_1$ is read out from the AND circuit $A_{11}$. By changing the voltage levels of the word input X and the bit input Y in this manner, data is consecutively read out from the memory cells $C_1$, $C_2$, and $C_3$ so that the characteristics of the memory can be checked by measuring the access time.

The description thus far concerns the data reading operation in the word line direction during the checking. The data reading operation in the bit line direction is conducted by fixing the bit input Y at the voltage level of 8 V, and by switching the voltage level of the word input X consecutively to 8 V, 3 V and 0 V. When the word input X is 8 V, the word line $Xl_1$ and the bit line $Yl_3$ are selected, as described above, so that the data in the memory cell $C_3$ is read out. When the word input X is at 3 V, the word line $Xl_2$ is selected so that the data in the memory cell $C_6$ is read out. When the word input X is at 0 V, the word line $Xl_3$ and the bit line $Yl_3$ are selected so that the data in the memory cell $C_9$ is read out. This means that the data in the checking memory cells $C_3$, $C_6$ and $C_9$ can be consecutively read out in the bit line direction of the circuit and is used to measure the access time to perform the check. However, a variety of further investigations conducted by the present inventors on this semiconductor memory device have revealed the following problems.

When the user uses the PROM, the voltage levels of the word address input X and the bit address input Y are 0 V and 3 V, whereas a voltage level of 8 V is additionally used during the checking. As has been described above, when checking of access times is changed from the checking memory cells in the word line direction to that on the memory cells in the bit line direction, the voltage level of the word address input X must be switched from 8 V to 3 V to 0 V. Thus, the voltage levels for selecting a memory cell during checking is different from that used by the user and the resultant access time is different from that obtained during use which reduces the checking accuracy.

Since the threshold voltages of the inverters $IV_1$ and $IV_5$ in the first stages of the check circuits 1 and 2 are set at 7 V, and are different from the 1.5 V threshold value of the inverters $IV_3$ and $IV_7$ which are used by the user, the circuit configurations of the inverters is accordingly more complicated. As a result of the more complicated circuit configuration, the signal delay in the inverters is different so that the access time obtained by the checking is different from that during use which reduces the checking accuracy.

The problems thus far described have been discovered by the present inventors.

SUMMARY OF THE INVENTION

One object of the present invention is to provide a memory device which can be checked under conditions identical to those of use.

The above object can be achieved by reading out data stored in main memory cells and checking memory cells with common input address terminals, input buffer, and output buffer, and by inputting to the input terminal of a chip-enable circuit a control signal determining whether the memory device is in operating mode or checking mode.

A memory device in accordance with the invention has an array of memory cells including a plurality of main memory cells which are adapted to be utilized by a user for storing information and a plurality of checking memory cells which store data placed therein at the time of manufacturing of the array which is read out to check a performance characteristic of the array of memory cells prior to the storing of data in the main memory cells; addressing means associated with the array of memory cells for permitting selective addressing of either the main memory cells or the checking memory cells within the array by the application of selected first or second signal levels to addressing lines coupled to the array; an output means coupled to the array of memory cells for outputting data from within selected cells within the array in cooperation with the addressing means; and an inhibiting means for inhibiting the outputting of data from said output means in response to the application of a control signal of a first predetermined magnitude. Further in accordance with the invention, the addressing means includes a checking memory addressing means coupled to the inhibiting means which enables the reading out of data from the checking memory cells upon the application of a control signal greater than a second predetermined magnitude to the inhibiting means and inhibits the reading out of data from the checking memory cells upon the application of a control signal of a magnitude less than the second predetermined magnitude. Preferably, the main memory cells are programmed ROMs and the control signals are applied to a chip selecting terminal.

DESCRIPTION OF THE PREFERRED EMBODIMENTS

The present invention will now be described in detail in connection with embodiments thereof, with reference to the accompanying drawings.

Embodiments

Figure 1:
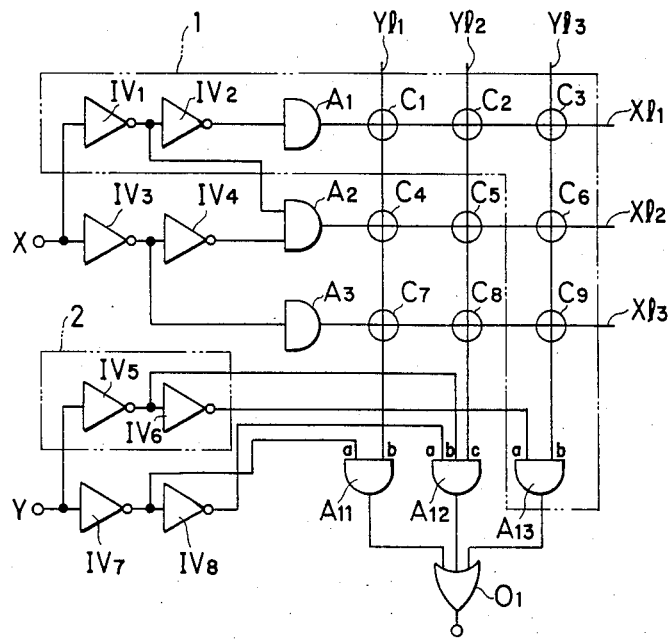
FIG. 1 is a circuit diagram of the bipolar PROM developed by the present inventors prior to the present invention.
Figure 2:
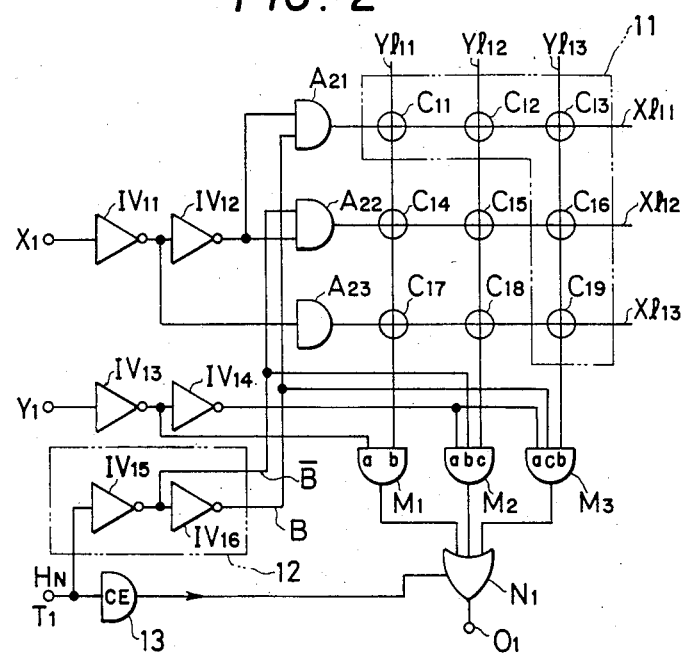
FIG. 2 is a circuit diagram of one embodiment of the PROM according to the present invention.
Figure 3:
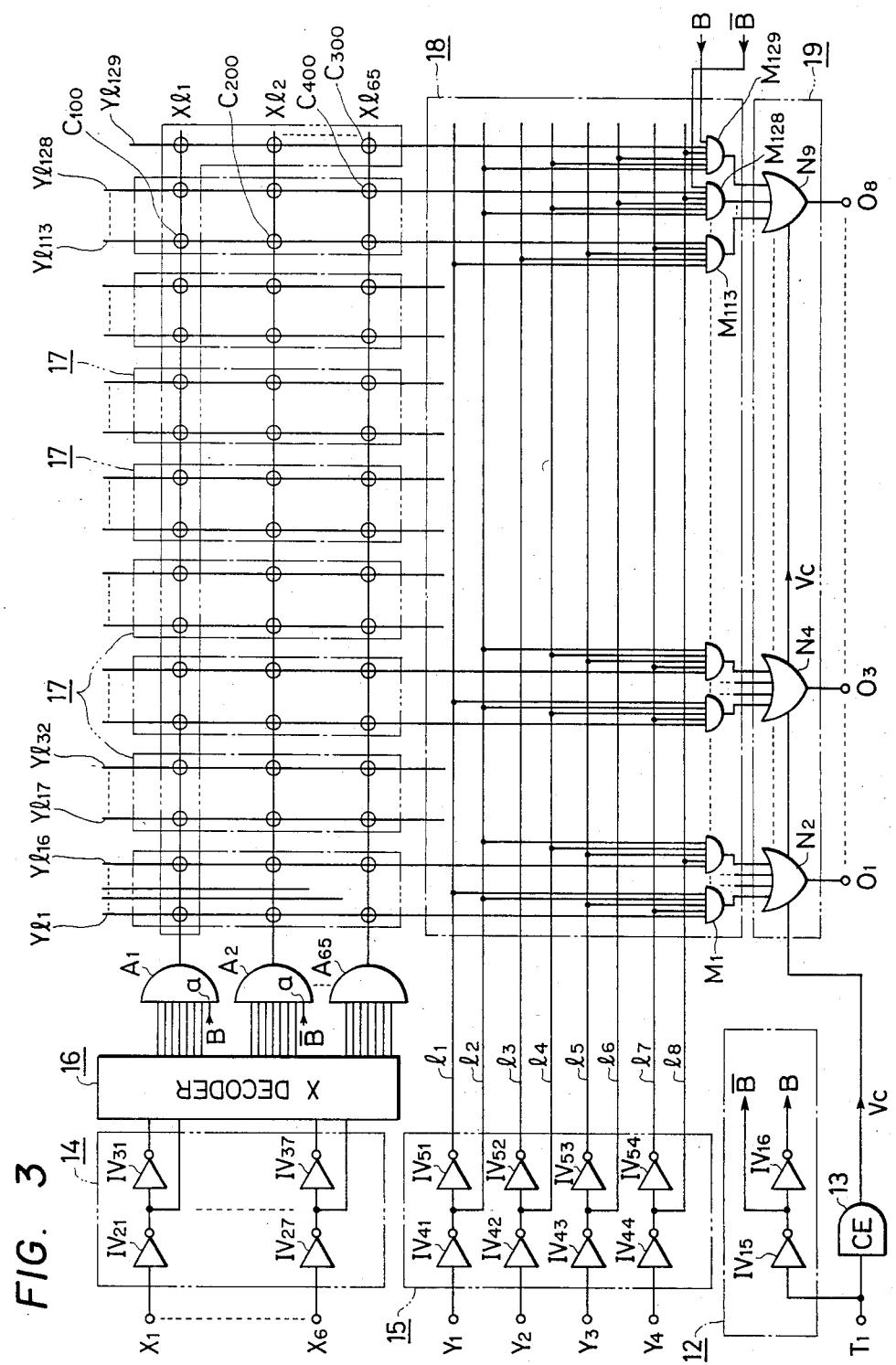
FIG. 3 is a circuit diagram of a specific example of the PROM of FIG. 2.

One embodiment of the checking circuit, to which the present invention is applied, will now be described with reference to FIGS. 2 to 4. FIG. 2 is a circuit diagram of the basic circuit construction of the checking circuit, and FIG. 3 is a circuit diagram of a more specific circuit construction.

The basic circuit operations will be described with reference to FIG. 2. Reference numeral 11 indicates a checking memory cell, and 12 indicates a control circuit for switching the PROM between an operating mode and a checking mode. Inverters $IV_{11}$ to $IV_{14}$ collectively form an address input buffer, and NOR circuit $N_1$ provides an output buffer. AND gates $M_1$ to $M_3$ function as multiplexers, and AND gates $A_{21}$, $A_{22}$ and $A_{23}$ function as word drivers. Lines $Xl_{11}$, $Xl_{12}$ and $Xl_{13}$ are word lines, lines $Yl_{11}$, $Yl_{12}$ and $Yl_{13}$ are bit lines, and cells $C_{11}$, $C_{12}$, $C_{13}$, $C_{14}$, $C_{15}$, $C_{16}$, $C_{17}$, $C_{18}$ and $C_{19}$ are memory cells.

In this circuit, a first signal, which is prepared by inverting the level of an input signal supplied to the input terminal of a chip-enable circuit 13 by inverter $IV_{15}$, and a signal which is prepared by inverting the level of the first signal by an inverter $IV_{16}$, are respectively supplied to the word drivers $A_{21}$ and $A_{22}$.

An important aspect of the invention is that the address input terminals $X_1$ and $Y_1$, the inverters $IV_{11}$ to $IV_{14}$ forming the input buffer and the output buffer $N_1$ are used in common for both checking and actual use of the memory. Hereinafter, the inverters $IV_{11}$, $IV_{12}$, $IV_{13}$ and $IV_{14}$, the word drivers $A_{21}$, $A_{22}$ and $A_{23}$ and the multiplexers $M_1$, $M_2$ and $M_3$ will be referred to collectively as "the address circuit".

The chip-enable circuit (a chip-select circuit) will now be briefly described. Recently a chip-enable circuit has been incorporated into most bipolar ROM ICs. The chip-enable circuit is used for expanding the capacity of the ROM while leaving the number of output bits unchanged when a plurality of ROMs are connected in parallel and controls whether any one memory IC chip is operative or inoperative. The chip-enable circuit 13 of the circuit of FIG. 2 is set so as to have an input threshold voltage of 1.5 V. The chip-enable circuit makes NOR circuit $N_1$ operative when a voltage higher than 1.5 V is applied, and inoperative when a voltage lower than 1.5 V is applied.

The input threshold voltages of the inverters $IV_{11}$, $IV_{12}$, $IV_{13}$, $IV_{14}$ and $IV_{16}$ are set at 1.5 V. Only the threshold voltage of the inverter $IV_{15}$ is set at 7 V.

The word input $X_1$ (e.g., 0 V and 3 V) is applied to the input terminal of the inverter $IV_{11}$. The bit input $Y_1$ (e.g. 0 V and 3 V) is applied to the input terminal of the inverter $IV_{13}$.

The checking voltage of 8 V is applied to the terminal $T_1$ when the PROM is being checked, and a voltage of 0 V or 3 V is applied to the terminal $T_1$ when the PROM is being used.

The procedure of checking the access time is explained as follows. First the checking operation in the word line direction is described. A voltage signal of about 8 V is applied to the input terminal $T_1$; a high-level signal (of 3 V) is applied to the word input $X_1$ and a low-level signal (of 0 V) is applied to the bit input $Y_1$. When the aforementioned potentials are present, the output signal $\overline{B}$ from the inverter $IV_{15}$ is at low level, and the output signal B from the inverter $IV_{16}$ is at high level. Similarly, the output signal from the inverter $IV_{11}$ is at low level; the output signal from the inverter $IV_{12}$ is at high level; the output signal from the inverter $IV_{13}$ is at high level; and the output signal from the inverter $IV_{14}$ is at low level. As a result, both inputs to the word driver $A_{21}$ are at high level and it operates to select the word line $Xl_{11}$. When the word line $Xl_{11}$ is selected, the word drivers $A_{22}$ and $A_{23}$ are inoperative which fixes the outputs at low level.

The inputs a and b of the multiplexer $M_2$ and the input a of the multiplexer $M_3$ are at L level so that the outputs of the multiplexers $M_2$ and $M_3$ are fixed at L level irrespective of the data in the checking memory cells. The input a of the multiplexer $M_1$ is H level so that the data in the checking memory cell $C_{11}$ is read out through the multiplexer $M_1$ through the NOR circuit $N_1$ which functions as the output buffer.

Another example of operation is described as follows. A voltage signal of 8 V is applied to the input terminal $T_1$, and a high-level signal (of 3 V) is applied simultaneously to the word input $X_1$ and the bit input $Y_1$. The output signal $\overline{B}$ goes to low level; the output signal B goes to high level; the output signal from the inverter $IV_{11}$ is at low level; and the output signal from the inverter $IV_{12}$ is high level. Similarly, the output signal from the inverter $IV_{13}$ is at low level, and the output signal from the inverter $IV_{14}$ is at high level. As a result, the word driver $A_{21}$ functions to select the word line $Xl_{11}$ and the word drivers $A_{22}$ and $A_{23}$ are inoperative. The multiplexer $M_3$ operates to select the bit line $Yl_{13}$, so that the data in the memory cell $C_{13}$ is read out.

The checking operation in the bit line direction is described as follows. The voltage signal of about 8 V is applied to the input terminal $T_1$; the voltage of 0 V is applied to the word input $X_1$, and the voltage signal of 3 V is applied to the bit input $Y_1$. The output signal $\overline{B}$ is at low level, and the output signal B is at high level. The output from the inverter $IV_{11}$ is at high level, and the output from the inverter $IV_{12}$ is at low level. The output from the inverter $IV_{13}$ is at low level, and the output from the inverter $IV_{14}$ is at high level. As a result, the word driver $A_{23}$ operates to select the word line $Xl_{13}$, and the word drivers $A_{21}$ and $A_{22}$ are inoperative. The multiplexer $M_3$ operates to select the bit line $Yl_{13}$, so that the data in the memory cell $C_{19}$ is read out.

The data in each of the checking memory cells, which is read out by these checking operations, is supplied from the corresponding multiplexers to the NOR circuit $N_1$. Data is obtained for each checking memory cell in response to an output signal $O_1$ from the NOR circuit $N_1$. The specifications are checked by repeating these operations to examine the access time.

In the PROM of FIG. 2, the input conditions for checking and for actual use are identical (i.e., 0 V or 3 V) so that the checks can be conducted without supplying any special checking voltage signal. When used by the user, the voltage supplied to the terminal $T_1$ is 0 V or 3 V, which ensures that the outputs from the checking word driver $A_{21}$ and the multiplexer $M_3$ are fixed at low level so that the data in the checking memory cells is not read out when the user is using the PROM.

The PROM of the present invention will be specifically described in the following with reference to FIGS. 3 and 4. FIG. 3 is a circuit diagram of a bipolar PROM which is constructed to have 1,024 words×8 bits, and which has one chip-enable input and an address decoder built in. FIG. 4 is an enlarged circuit diagram of the multiplexers and an output buffer of the PROM of FIG. 3.

Reference numeral 13 in FIG. 3 indicates the chip-enable circuit which makes NOR circuits (output buffers) $N_2$ to $N_9$ operative when its terminal $T_1$ has applied a voltage higher than 1.5 V, and inoperative when a voltage lower than 1.5 V is applied. Reference numeral 14 designates a word address buffer which corresponds to the inverters $IV_{11}$ and $IV_{12}$ of FIG. 2. Numeral 15 designates a bit address buffer which corresponds to the inverters $IV_{13}$ and $IV_{14}$ of FIG. 2. Numeral 16 designates a decoder for decoding 1:64. Numeral 17 designates memory cell blocks of 1,024 (i.e., 16×64) bits, which form a memory cell array of a total of 8,192 bits. Numeral 18 designates a 1:16 multiplexer which corresponds to the multiplexers $M_1$, $M_2$ and $M_3$ of FIG. 2. The word address buffer 14, the bit address buffer 15, the X decoder 16, the word drivers $A_1$ to $A_{65}$ and the multiplexers $M_1$ to $M_{129}$ will be referred to collectively as "the address circuit" below. $N_2$ to $N_9$ indicate the NOR circuits which correspond to the NOR circuit $N_1$ of FIG. 2, and which together form an output buffer 19.

The word driver $A_1$ is used for checking the access time and the sixty-four drivers $A_2$ to $A_{65}$ are used by the user. The circles in the drawing indicate each of the memory cells. In particular, the block enclosed in the triple-dot-dash line is the checking memory cell.

The features of the PROM are explained as follows. First of all, the address circuit and the output buffer 19 are used in common when the checking memory cells are selected, and when the main memory cells are selected. The respective output signals $\overline{B}$ and B from the inverters $IV_{15}$ and $IV_{16}$ which form the checking address circuit 12 are applied to the word drivers $A_1$ and $A_2$ and the multiplexers $M_{128}$ and $M_{129}$. In accordance with the invention as described, the word drivers $A_1$ and $A_2$ are prevented from operating simultaneously when a predetermined input condition is imposed upon the word inputs $X_1$ to $X_6$, so that the checking operations and the operations of actual use are separated. Moreover, the input threshold voltage of the inverter $IV_{15}$ is set at 7 V (whereas the input threshold voltage of the inverter $IV_{16}$ is set at 1.5 V).

An example of the checking operation is explained below, with reference to the reading of data from a memory cell $C_{100}$. In this case, the voltage signal of 8 V is first applied to the input terminal $T_1$ to switch the PROM to checking mode. A voltage of 0 V or 3 V is applied to the word inputs $X_1$ to $X_6$ so that the corresponding input terminals of the word drivers $A_1$ and $A_2$ are at high level. The output signal $\overline{B}$ from the inverter $IV_{15}$ is at low level, and the output signal B from the inverter $IV_{16}$ is at high level. As a result, the output from the word driver $A_2$ is at low level while the output from the word driver $A_1$ is at high level so that the word line $Xl_1$ is selected.

Figure 4:
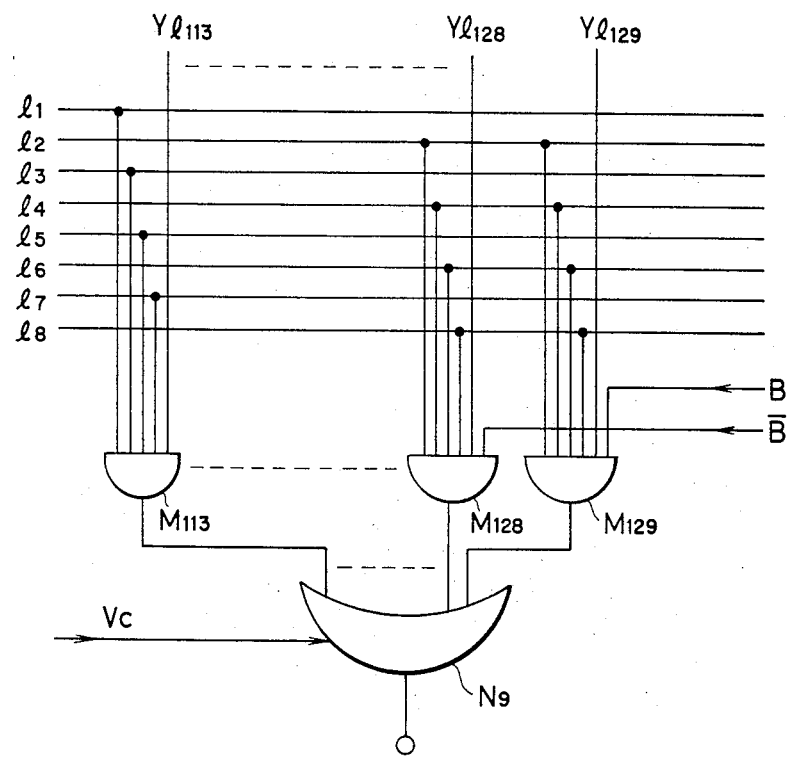
FIG. 4 is a circuit diagram of the construction of the essential parts of the multiplexer of the PROM of FIG. 3.

When the voltage signal of 3 V is applied to all of the bit inputs $Y_1$ to $Y_4$, all the lines $l_1$, $l_3$, $l_5$ and $l_7$ of FIGS. 3 and 4 go to high level because of the operations of the inverters $IV_{41}$ to $IV_{44}$ and $IV_{51}$ to $IV_{54}$ and all of the lines $l_2$, $l_4$, $l_6$ and $l_8$ go to low level. As a result, the bit line $Y_{113}$ is selected and the data in the memory cell $C_{100}$ is read out through the multiplexer $M_{113}$ so that an output signal $O_8$ is obtained through the NOR circuit $N_9$ acting as the output buffer. Because the voltage signal of 8 V is supplied to the input terminal $T_1$, a control signal $V_C$ is supplied from the chip-enable circuit 13 to the NOR circuit $N_9$ so that this NOR circuit $N_9$ is made operative.

When the data in a main memory cell $C_{200}$ is to be read out, the voltage signal of 3 V is supplied to the terminal $T_1$ to switch the PROM to the operating mode so that the data in the memory cell $C_{200}$ is read out if the addresses $X_1$ to $X_6$ and $Y_1$ to $Y_4$ are set to the same input conditions as those described above when the data in the checking memory cell $C_{100}$ is read out.

The reading out of the data in a checking memory cell $C_{300}$ is described as follows. The voltage signal of 8 V is applied to the input terminal $T_1$ so that the PROM is switched to checking mode. The word inputs $X_1$ to $X_6$ are supplied with inputs determined by the combination of the decoder 16. As a result, the output from the word driver $A_{65}$ is at high level so that the word line $Xl_{65}$ is selected. All the bit inputs $Y_1$ to $Y_4$ are applied with the low-level voltage (i.e., 0 V) so that all the lines $l_1$, $l_3$, $l_5$ and $l_7$ are made low level by the operations of the inverters $IV_{41}$ to $IV_{44}$ and $IV_{51}$ to $IV_{54}$. The lines $l_2$, $l_4$, $l_6$ and $l_8$ are at high level.

All the inputs to the multiplexers $M_{128}$ and $M_{129}$ are high level. Since the PROM is in the checking mode, the control signal B is at high level; the control signal $\overline{B}$ is at low level; and the output from the multiplexer $M_{128}$ is fixed at low level. The data in the checking memory cell $C_{300}$ is read out through the multiplexer $M_{129}$ and the NOR circuit $N_9$.

When the data in the memory cell $C_{400}$ is to be read out, a voltage signal of 3 V is applied to the terminal $T_1$, and the same input conditions as those present when the data in the checking memory cell $C_{300}$ was read out are imposed upon the addresses $X_1$ to $X_6$ and $Y_1$ to $Y_4$. The data in the memory cell $C_{400}$ is then read out through the multiplexer $M_{128}$ and the NOR circuit $N_9$.

The PROM described above has the following advantages. Since the access time is checked under the same input conditions (i.e., 0 V and 3 V) as those when the PROM is actually used, the measuring accuracy is so improved that accurate checks can be conducted. Since the checking circuit for the checking of the memory cells and the circuit for actual use have an identical construction, the access time measured by using the checking memory cells and the access time when in actual use are the same which results in the checking accuracy being improved. Since the address buffers and the output buffers are used in common for the checking operations and for actual use, the numbers of inputs and outputs do not increase. Since the switching operations of the checking mode and the operating mode are conducted by making use of the input terminals of the chip-enable (CE) circuit, it is unnecessary to provide an additional dedicated input pin. As a result, there is no increase in the number of required pins of the PROM IC, so that the size of the IC package is not increased.

In the embodiment shown in FIGS. 3 and 4, the chip-enable circuit has the function of making the output buffers $N_2$ to $N_9$ operative when a high-level input signal is received. However, there is another chip-enable circuit which makes the NOR circuits $N_2$ to $N_9$ inoperative when the high-level input is received. This is exemplified by the case in which the chip-enable circuit acts as an inverter. The low-level output $V_C$ of the chip-enable circuit makes the NOR circuits $N_2$ to $N_9$ inoperative when a voltage higher than 1.5 V is applied to the terminal $T_1$, and makes the NOR circuits $N_2$ to $N_9$ operative when a voltage lower than 1.5 V is applied. With the circuit described above, the output $V_C$ of the chip-enable circuit is low level when the voltage signal of 8 V is applied to the terminal $T_1$, so that the NOR circuits $N_2$ to $N_9$ cease to operate. The data written into the checking memory cells cannot be read out, so that the access time cannot be measured.

Figure 5:
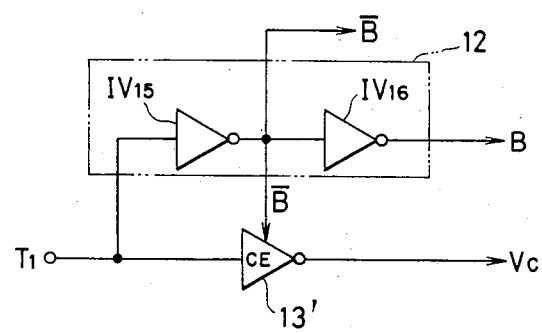
FIG. 5 is a circuit diagram of another embodiment of the present invention.

The same effects as those of the previous embodiment can be obtained by making the device shown in FIG. 5, to remove the above defects.

More specifically, a chip-enable circuit 13' is constructed of TTL inverters with tri-state outputs. The threshold voltage of the inverter $IV_{15}$ is set at 7 V, in the same way as that of the previous embodiment, and the threshold voltage of the inverter $IV_{16}$ is set at 1.5 V. When the terminal $T_1$ has applied a voltage lower than 1.5 V, the resultant high-level output $V_C$ makes the NOR circuits $N_2$ to $N_9$ operative. When the terminal $T_1$ has applied a voltage higher than 1.5 V, the low-level output $V_C$ of the chip-enable circuit makes the NOR circuits $N_2$ to $N_9$ inoperative. It should be noted that, when the voltage signal of 8 V is applied during checking to the terminal $T_1$, the output $\overline{B}$ from the inverter $IV_{15}$ is at low level, which brings the chip-enable circuit 13' to a high-impedance state (floating state) so that the floating output $V_C$ stops the control on the NOR circuits $N_2$ to $N_9$. At this time, the NOR circuits are operative because they are not controlled. The output buffers are made operative to read out the data from the checking memory cells when the voltage signal of 8 V is applied to the terminal $T_1$ during the checking by the PROM manufacturer. The checking operations are similar to those described before. When in actual use (by the user), the PROM is switched to the operating mode by applying the signal voltage of 0 V to the terminal $T_1$. In accordance with the circuit construction thus far described, the same effects as those of the previous embodiment can be obtained, even although the chip-enable circuit 13' is constructed of inverters.

Although the present invention has been specifically described in connection with specific embodiments, it should not be limited to those embodiments.

For example, while the multiplexers, the NOR circuits, etc., of FIG. 4 are described as combinations of logic circuits, it should be understood that they can be constructed of diodes or TTL circuits.

The memory circuit may be a memory structure of any capacity.

While the present invention has been mainly described with reference to the checking of a bipolar PROM, it should be understood that the invention is not limited to that application.

For example, the memory cells are not limited to those of a bipolar PROM. The circuit technique of the present invention can be applied to memory cells having a ROM structure.

Even if the memory cells are of the type used in electronic computers or other various industrial devices, the circuit technique of the present invention can also be applied to the process of inspecting them.

What is claimed is:

1. A memory device comprising:
   (a) an array of memory cells including a plurality of main memory cells which are adapted to be utilized by a user for storing information and a plurality of checking memory cells which store data placed therein at the time of manufacturing of the array which is read out to check a performance characteristic of the array of memory cells prior to the storing of data in the main memory cells;
   (b) an addressing means associated with the array of memory cells for permitting selective addressing of either the main memory cells or checking memory cells within the array by the application of selected first or second signal levels to addressing lines coupled to the array;
   (c) an output means coupled to the array of memory cells for outputting data from within selected cells within the array in cooperation with the addressing means; and
   (d) an inhibiting means for inhibiting the outputting of data from said output means in response to the application of a control signal of a first predetermined magnitude, wherein the addressing means includes a checking memory addressing means coupled to the inhibiting means which inhibits the reading out of data from the checking memory cells upon application of a control signal of a second predetermined magnitude and enables the reading out of data from the checking memory cells upon the application of a control signal of a third predetermined magnitude.

2. A memory device according to claim 1, wherein the main memory cells are programmable ROMs.

3. A memory device according to claim 2, wherein said control signals are applied to a chip selecting terminal.

4. A memory device in accordance with claim 1 wherein
   (a) said array of memory cells are arranged in a plurality of rows and columns with a separate word line being coupled to each of the cells in each row and a separate bit line being coupled to each of the cells in each column;
   (b) said addressing means includes a separate AND gate coupled to each word and bit line;
   (c) a plurality of word addressing input lines coupled to the AND gates of the word lines and a plurality of bit addressing lines coupled to the AND gates of the bit lines, the selective application of the first and second signal levels to the word and bit addressing lines opening the AND gates for selecting a cell within the array;
   (d) said output means has at least one NOR gate having inputs coupled to the outputs of each of the AND gates which are coupled to the bit lines and a control terminal which is coupled to the source of the control signal which disables each of said NOR gates from passing information present at the output of each of the AND gates which are coupled to the bit lines when the control signal is greater than the first predetermined magnitude; and
   (e) said checking addressing memory means includes a first inverter circuit having an input coupled to the source of the control signal and an output for producing a first checking memory gating signal and a second inverter having an input coupled to the output of the first inverter and an output for producing a second checking memory gating signal, the first and second outputs of the inverters being coupled to selected ones of the AND gates coupled to the word and bit lines for permitting the accessing of the checking memory cells upon the application of a control signal equal to or greater than the second predetermined magnitude to the inhibiting means.

5. A memory device in accordance with claim 4 wherein said first inverter has a threshold which passes a control signal having the second predetermined magnitude of but does not pass a signal less than the second predetermined level.

* * * * *